(12) United States Patent
Takezoe et al.

(10) Patent No.: US 7,701,537 B2
(45) Date of Patent: Apr. 20, 2010

(54) OPTICAL DIODE

(75) Inventors: Hideo Takezoe, Tokyo (JP);
Byoungchoo Park, Tokyo (JP); Myoung Hoon Song, Tokyo (JP); Jisoo Hwang, Tokyo (JP); Takehiro Toyooka, Yokohama (JP); Suzushi Nishimura, Yokohama (JP)

(73) Assignees: Tokyo Institute of Technology, Tokyo (JP); Nippon Oil Corporation, Tokyo (JP)

( * ) Notice: Subject to any disclaimer, the term of this patent is extended or adjusted under 35 U.S.C. 154(b) by 233 days.

(21) Appl. No.: 11/712,954

(22) Filed: Mar. 2, 2007

(65) Prior Publication Data

US 2007/0221921 A1  Sep. 27, 2007

(51) Int. Cl.
*G02F 1/1335* (2006.01)
(52) U.S. Cl. .......................... 349/115; 349/9; 349/179; 359/589
(58) Field of Classification Search .................. 257/53, 257/49, 52; 349/117, 69, 70, 71, 50, 127, 349/9, 96, 179, 115; 359/589; 372/96
See application file for complete search history.

(56) References Cited

U.S. PATENT DOCUMENTS

| | | | |
|---|---|---|---|
| 5,559,825 A | 9/1996 | Scalora et al. | |
| 5,727,107 A * | 3/1998 | Umemoto et al. | 385/116 |
| 5,760,859 A * | 6/1998 | Bosma et al. | 349/75 |
| 6,147,734 A * | 11/2000 | Kashima | 349/113 |
| 6,266,113 B1 * | 7/2001 | Yamazaki et al. | 349/115 |
| 6,717,640 B2 * | 4/2004 | Sato et al. | 349/112 |

FOREIGN PATENT DOCUMENTS

| | | |
|---|---|---|
| JP | 49 5645 | 1/1974 |
| JP | 51-94251 | 8/1976 |
| JP | 56-22509 | 7/1979 |
| JP | 4-60511 | 2/1992 |
| JP | 5-241100 | 9/1993 |
| JP | 2000-268398 | 9/2000 |
| JP | 2001-249225 | 9/2001 |
| JP | 2003-294948 | 10/2003 |
| JP | 2003-330025 | 11/2003 |

OTHER PUBLICATIONS

International Search report dated Oct. 4, 2005.
Japanese Office Action dated Dec. 8, 2009.

* cited by examiner

*Primary Examiner*—Thoi V Duong
(74) *Attorney, Agent, or Firm*—Finnegan, Henderson, Farabow, Garrett & Dunner, LLP

(57) ABSTRACT

An optical diode. A cholesteric liquid crystal (CLC) layer has a selective reflection wavelength band with a left-handed helical structure, and a phase shifter for changing a phase difference between two intrinsic polarized light components of left-handed circularly polarized light having a wavelength within the selective reflection wavelength band of the CLC layer. When left-handed circularly polarized light having a wavelength within the selective reflection wavelength band of the CLC layer is incident on the phase shifter in the optical diode, the phase shifter turns the left-handed circularly polarized light into right-handed circularly polarized light, which can be transmitted through the CLC layer. When left-handed circularly polarized light having a wavelength within the selective reflection wavelength band of the CLC layer is incident on the CLC layer, it is selectively reflected by the CLC layer.

4 Claims, 12 Drawing Sheets

OPTICAL DIODE

TECHNICAL FIELD

The present invention relates to a optical diode which changes the quantity of transmitted light depending on the direction of light incident thereon.

BACKGROUND ART

Optical diodes which change the quantity of transmitted light depending on the direction of light incident thereon have conventionally been known (see, for example, the following Patent Document 1). This document proposes an optical diode consisting of a laminate in which low-refractive-index layers and high-refractive-index layers are alternately laminated, the refractive indexes of the low-refractive-index and high-refractive-index layers gradually increase along the thickness direction of the laminate, and the low-refractive-index or high-refractive-index layers have a nonlinear optical characteristic.

It is supposed that, when laser light having such a high intensity as to cause a nonlinear optical effect in a low-refractive-index or high-refractive-index layer is incident thereon, this optical diode partly transmits the light incident on one side of the laminate but substantially reflects the light incident on the other side.

Patent Document 1: U.S. Pat. No. 5,559,825

DISCLOSURE OF THE INVENTION

Problem to be Solved by the Invention

However, the above-mentioned conventional optical diode has the following problems.

Namely, the above-mentioned conventional optical diode consists of a laminate in which low-refractive-index and high-refractive-index layers are alternately laminated, which requires an extreme amount of time and labor to manufacture, and thus is hard to lower its cost.

Also, for realizing an optical diode characteristic in the above-mentioned optical diode, it is necessary for laser light having such a high intensity as to cause the nonlinear optical effect in a low-refractive-index or high-refractive-index layer to be incident on the optical diode, which makes it hard to save electric power.

In view of the foregoing circumstances, it is an object of the present invention to provide an optical diode which can lower the cost and save electric power.

Means for Solving Problem

For solving the above-mentioned problem, the optical diode of the present invention is characterized in that it comprises a phase shifter for changing a phase difference between two intrinsic polarized light components of incident polarized light and a polarizer for transmitting only one of the two intrinsic polarized light components of the light transmitted through the phase shifter and prevents from transmitting the remaining intrinsic polarized light component by absorbing or reflecting the same, or comprises a rotator for rotating the polarization direction of incident polarized light and the polarizer. Specifically, the optical diode of the present invention is characterized in that it comprises a cholesteric liquid crystal layer having a selective reflection wavelength band and a phase shifter for changing a phase difference between two intrinsic polarized light components at a wavelength within the selective reflection wavelength band of the cholesteric liquid crystal layer; comprises a phase shifter for changing a phase difference between two intrinsic polarized light components of incident polarized light and a linearly polarizing element for transmitting a part of the light transmitted through the phase shifter; or comprises a rotator for rotating the polarization direction of incident polarized light and a linearly polarizing element for transmitting a part of the light transmitted through the rotator.

In the optical diode comprising a cholesteric liquid crystal layer having a selective reflection wavelength band and a phase shifter for changing a phase difference between two intrinsic polarized light components at a wavelength within the selective reflection wavelength band of the cholesteric liquid crystal layer, the phase shifter changes the phase difference between the two intrinsic polarized light components when circularly polarized light having a wavelength within the selective reflection wavelength band of the cholesteric liquid crystal layer and a rotation direction identical to a helical sense of the cholesteric liquid crystal layer is incident on the phase shifter, for example. Therefore, when the light emitted from the phase shifter is incident on the cholesteric liquid crystal layer, this light can be transmitted through the cholesteric liquid crystal layer. When circularly polarized light having a wavelength within the selective reflection wavelength band of the cholesteric liquid crystal layer and a rotation direction identical to the helical sense of the cholesteric liquid crystal layer is incident on the cholesteric liquid crystal layer, on the other hand, this circularly polarized light is selectively reflected by the cholesteric liquid crystal layer. Thus, an optical diode characteristic is realized. The above-mentioned optical diode characteristic is also realized when circularly polarized light having a wavelength within the selective reflection wavelength band of the cholesteric liquid crystal layer and a rotation direction opposite to the helical sense of the cholesteric liquid crystal layer is used. This optical diode can lower its cost, since it does not require a large amount of time and labor. Further, since this optical diode does not utilize the nonlinear optical effect, it is not necessary for laser light having such a high intensity as to cause the nonlinear optical effect to be incident thereon as incident light. Therefore, it can save power as well.

Preferably, in the above-mentioned optical diode, the phase shifter changes the phase difference between the two intrinsic polarized light components of the circularly polarized light having a wavelength within the selective reflection wavelength band of the cholesteric liquid crystal layer by 160° to 200°.

When the circularly polarized light is incident on the phase shifter in this case, circularly polarized light in a rotation direction opposite to that of the former circularly polarized light, i.e., polarized light in a polarization state close to that of the circularly polarized light having a rotation direction opposite to the helical sense of the cholesteric liquid crystal layer, is emitted, so as to be sufficiently prevented from being reflected by the cholesteric liquid crystal layer. Therefore, the quantity of transmitted light can be increased more when circularly polarized light is incident from the phase shifter side.

Preferably, the above-mentioned optical diode further comprises a second cholesteric liquid crystal layer having a selective reflection wavelength band which is different from that of the above-mentioned cholesteric liquid crystal layer acting as a first cholesteric liquid crystal layer; wherein the phase shifter changes a phase difference between two intrinsic polarized light components at a wavelength between a center wavelength of the selective reflection wavelength band of the first cholesteric liquid crystal layer and a center wavelength of the selective reflection wavelength band of the second cholesteric liquid crystal layer by 160° to 200°. Here, the center wavelength of the selective reflection wavelength band in each of the first and second cholesteric liquid crystal layers refers to the wavelength calculated by arithmetic average of two wavelengths which yield a transmittance of 60% at shorter and longer wavelength ends of the selective reflection wavelength band in a spectral transmission curve of the cholesteric liquid crystal layer alone.

In this case, the optical diode characteristic is realized either when circularly polarized light having a wavelength within the selective reflection wavelength band of the first cholesteric liquid crystal layer is incident or when circularly polarized light having a wavelength within the selective reflection wavelength band of the second cholesteric liquid crystal layer is incident. Namely, the optical diode characteristic is realized for two different wavelength light components.

Preferably, the phase shifter changes a phase difference between two intrinsic polarized light components at a wavelength which is within the selective reflection wavelength band of the first cholesteric liquid crystal layer but outside the selective reflection wavelength band of the second cholesteric liquid crystal layer by 160° to 200°.

When circularly polarized light having a wavelength outside the selective reflection wavelength band of the second cholesteric liquid crystal layer is incident from the second cholesteric liquid crystal layer side in this case, this circularly polarized light can be sufficiently transmitted through the second cholesteric liquid crystal layer without being selectively reflected thereby. Therefore, the quantity of light emitted from the first cholesteric liquid crystal layer side can be increased.

In another aspect, the optical diode of the present invention is characterized in that it comprises a phase shifter for changing a phase difference between two intrinsic polarized light components of incident polarized light and a linearly polarizing element for transmitting a part of the light transmitted through the phase shifter.

When polarized light parallel to an absorption axis direction of the linearly polarizing element is incident on the phase shifter in this optical diode, the phase shifter changes the phase difference between two intrinsic polarized light components of the incident polarized light. Then, a part of the light transmitted through the phase shifter is transmitted through the linearly polarizing element. When linearly polarized light is incident on the linearly polarizing element parallel to the absorption axis direction of the linearly polarizing element, on the other hand, the incident linearly polarized light is completely absorbed by the linearly polarizing element, whereby the light emitted from the phase shifter can be made zero. Thus realized is an optical diode characteristic in which the quantity of transmitted light changes depending on the direction of light incident thereon. This optical diode can lower its cost, since it does not require a large amount of time and labor. Further, since this optical diode does not utilize the nonlinear optical effect, it is not necessary for laser light having such a high intensity as to cause the nonlinear optical effect to be incident thereon as incident light. Therefore, it can save power as well.

Preferably, the optical diodes mentioned in the foregoing further comprise a pair of electrodes holding the phase shifter therebetween, and the phase shifter is constituted by a low molecular-weight nematic liquid crystal.

In this case, the contrast ratio between the transmitted light obtained when linearly polarized light is incident from the linearly polarizing element side and the transmitted light obtained when linearly polarized light is incident from the phase shifter side can be adjusted to an optimal value.

In still another aspect, the optical diode of the present invention is characterized in that it comprises a rotator for rotating a polarization direction of incident polarized light and a linearly polarizing element for transmitting a part of the light transmitted through the rotator.

When linearly polarized light having a polarization direction in the absorption axis direction of the linearly polarizing element is incident from the rotator side in this optical diode, the polarization direction of the polarized light is rotated by the rotator. Then, most of the light transmitted through the rotator is transmitted through the linearly polarizing element. When linearly polarized light is incident from the linearly polarizing element side in the absorption axis direction of the linearly polarizing element, on the other hand, this linearly polarized light is not transmitted through the rotator. Thus realized is an optical diode characteristic in which the quantity of transmitted light changes depending on the direction of light incident thereon. This optical diode can lower its cost, since it does not require a large amount of time and labor. Further, since this optical diode does not utilize the nonlinear optical effect, it is not necessary for laser light having such a high intensity as to cause the nonlinear optical effect to be incident thereon as incident light. Therefore, it can save power as well.

Preferably, the optical diode having the rotator further comprises a pair of electrodes holding the rotator therebetween, and the rotator is constituted by a low molecular-weight nematic liquid crystal.

In this case, the contrast ratio between the transmitted light obtained when linearly polarized light is incident from the linearly polarizing element side and the transmitted light obtained when linearly polarized light is incident from the rotator side can be adjusted to an optimal value.

Effect of the Invention

The optical diodes of the present invention can lower the cost and save electric power.

EXPLANATIONS OF NUMERALS

2 . . . cholesteric liquid crystal layer (first cholesteric liquid crystal layer); 3 . . . cholesteric liquid crystal layer (second cholesteric liquid crystal layer); 4, 24, 34 . . . phase shifter; 44 . . . 90° rotator; 1, 21, 31, 41 . . . optical diode; 32, 42 . . . linearly polarizing element.

BEST MODES FOR CARRYING OUT THE INVENTION

In the following, embodiments of the optical diode in accordance with the present invention will be explained in detail.

First Embodiment

Figure 1:
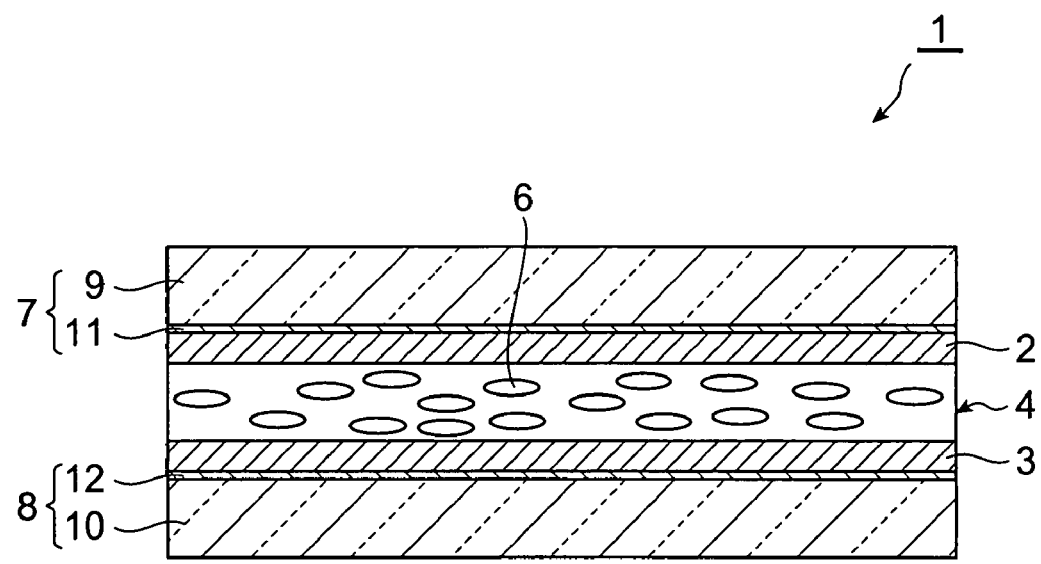
[FIG. 1] A sectional view showing a first embodiment of the optical diode of the present invention.

FIG. 1 is a sectional view schematically showing an embodiment of the optical diode in accordance with the present invention. As shown in FIG. 1, an optical diode 1 comprises a cholesteric liquid crystal layer (first cholesteric liquid crystal layer) 2 and a cholesteric liquid crystal layer (second cholesteric liquid crystal layer) 3, which are arranged so as to oppose each other. The cholesteric liquid crystal layers 2, 3 have the same helical sense (chirality), which is left-handed in this embodiment. The selective reflection wavelength band of the cholesteric liquid crystal layer 2 and the selective reflection wavelength band of the cholesteric liquid crystal layer 3 differ from each other. In other words, the center wavelength of the selective reflection wavelength band of the cholesteric liquid crystal layer 2 and the center wavelength of the selective reflection wavelength band of the cholesteric liquid crystal layer 3 deviate from each other.

A phase shifter 4 is provided between the cholesteric liquid crystal layers 2, 3. The phase shifter 4 changes the phase difference between two intrinsic polarized light components at a wavelength between the center wavelength of the selective reflection wavelength band of the cholesteric liquid crystal layer 2 and the center wavelength of the selective reflection wavelength band of the cholesteric liquid crystal layer 3 by about 180°, i.e., functions as a half-wavelength element.

A transparent alignment substrate 7 may be provided on the cholesteric liquid crystal layer 2 on the side opposite from the phase shifter 4, whereas a transparent alignment substrate 8 may be provided on the cholesteric liquid crystal layer 3 on the side opposite from the phase shifter 4.

In this optical diode 1, left-handed circularly polarized light having a wavelength within the selective reflection wavelength band of the cholesteric liquid crystal layer 2 is made incident on the cholesteric liquid crystal layer 3. Employed here as the wavelength of the incident left-handed circularly polarized light is a wavelength which falls within the selective reflection wavelength band of the cholesteric liquid crystal layer 2 but outside the selective reflection wavelength band of the cholesteric liquid crystal layer 3.

Then, this left-handed circularly polarized light can be transmitted through the cholesteric liquid crystal layer 3 without being selectively reflected thereby.

When this left-handed circularly polarized light is incident on the phase shifter 4, the phase shifter 4 changes the phase difference between the two intrinsic polarized light components. Here, the phase shifter 4 changes the phase difference between polarized light components at a wavelength between the center wavelength of the selective reflection wavelength band of the cholesteric liquid crystal layer 2 and the center wavelength of the selective reflection wavelength band of the cholesteric liquid crystal layer 3 by about 180°, i.e., functions as a half-wavelength element. Therefore, the left-handed circularly polarized light transmitted through the cholesteric liquid crystal layer 3 substantially changes its phase by 180°, thereby becoming polarized light in a polarization state close to that of right-handed circularly polarized light.

Then, the polarized light emitted from the phase shifter 4 is made incident on the cholesteric liquid crystal layer 2. Here, this polarized light has a polarization state close to that of right-handed circularly polarized light while having a wavelength within the selective reflection wavelength band of the cholesteric liquid crystal layer 2. Therefore, this polarized light can be transmitted through the cholesteric liquid crystal layer 2. When left-handed circularly polarized light having a wavelength within the selective reflection wavelength band of the cholesteric liquid crystal layer 2 is incident on the cholesteric liquid crystal layer 2, on the other hand, this left-handed circularly polarized light is selectively reflected by the cholesteric liquid crystal layer 2.

In this optical diode 1, left-handed circularly polarized light having a wavelength within the selective reflection wavelength band of the cholesteric liquid crystal layer 3 is also made incident on the cholesteric liquid crystal layer 2. Employed here as the wavelength of the incident left-handed circularly polarized light is a wavelength which falls within the selective reflection wavelength band of the cholesteric liquid crystal layer 3 but outside the selective reflection wavelength band of the cholesteric liquid crystal layer 2.

Then, this left-handed circularly polarized light can be transmitted through the cholesteric liquid crystal layer 2 without being selectively reflected thereby.

When this left-handed circularly polarized light is incident on the phase shifter 4, the phase shifter 4 changes the phase difference between the two intrinsic polarized light components. Here, the phase shifter 4 changes the phase difference between polarized light components at a wavelength between the center wavelength of the selective reflection wavelength band of the cholesteric liquid crystal layer 2 and the center wavelength of the selective reflection wavelength band of the cholesteric liquid crystal layer 3 by about 180°, i.e., functions as a half-wavelength element. Therefore, the left-handed circularly polarized light transmitted through the cholesteric liquid crystal layer 2 substantially changes its phase by 180°, thereby becoming polarized light in a polarization state close to that of right-handed circularly polarized light.

Then, the polarized light emitted from the phase shifter 4 is made incident on the cholesteric liquid crystal layer 3. Here, this polarized light has a polarization state close to that of right-handed circularly polarized light while having a wavelength within the selective reflection wavelength band of the cholesteric liquid crystal layer 3. Therefore, this polarized light can be transmitted through the cholesteric liquid crystal layer 3. When left-handed circularly polarized light having a wavelength within the selective reflection wavelength band of the cholesteric liquid crystal layer 3 is incident on the cholesteric liquid crystal layer 3, on the other hand, this left-handed circularly polarized light is selectively reflected by the cholesteric liquid crystal layer 3.

Thus, the optical diode 1 realizes an optical diode characteristic for circularly polarized light at two different wavelengths. The optical diode 1 also realizes an optical diode characteristic when right-handed circularly polarized light is used in place of left-handed circularly polarized light as incident light.

Though a case where the cholesteric liquid crystal layers 2 and 3 have the same helical sense is exemplified, the optical diode characteristic can also be realized when their helical senses are opposite to each other.

In the case where the helical senses are opposite to each other, the optical diode characteristic can be exhibited for two different wavelengths when the selective reflection wavelength bands of the cholesteric liquid crystal layers 2 and the cholesteric liquid crystal layers 3 are shifted from each other, whereas a device in which the polarization state and incident direction of incident light have a complementary relationship to whether transmitted light exists or not and the polarization state of transmitted light can be realized when the selective reflection wavelength bands are to be same. Namely, when right-handed polarized light is incident from the cholesteric liquid crystal layer 2 side in the case where the cholesteric liquid crystal layers 2 and the cholesteric liquid crystal layers 3 have left- and right-handed helical structures, respectively, in this device, for example, the right-handed polarized light is transmitted through the cholesteric liquid crystal layer 2 and then is turned into left-handed circularly polarized light by the phase shifter 4, so as to be transmitted through the cholesteric liquid crystal layer 3. When right-handed circularly polarized light is incident from the cholesteric liquid crystal layer 3 side, by contrast, this right-handed circularly polarized light is selectively reflected by the cholesteric liquid crystal layer 3 and is not transmitted through the cholesteric liquid crystal layer 2. The optical diode characteristic can also be realized when the cholesteric liquid crystal layers 2 and 3 have the same selective reflection wavelength band while having helical senses opposite to each other.

The optical diode 1 can lower its cost, since it does not require a large amount of time and labor. Further, since the optical diode 1 does not utilize the nonlinear optical effect, it is not necessary for laser light having such a high intensity as to cause the nonlinear optical effect to be incident thereon as incident light. Therefore, it can save power as well.

Next, structures of the above-mentioned phase shifter 4 and cholesteric liquid crystal layers 2, 3 will now be explained in detail.

The phase shifter 4 is not limited in particular as long as it changes the phase difference between two intrinsic polarized light components at a wavelength between the center wavelength of the selective reflection wavelength band of the cholesteric liquid crystal layer 2 and the center wavelength of the selective reflection wavelength band of the cholesteric liquid crystal layer 3 by about 180°. For example, the phase shifter 4 is constituted by an anisotropic medium. Employed as the anisotropic medium is one containing a nematic liquid crystal 6.

Employable as the anisotropic medium are uniaxially or biaxially stretched films made of polycarbonate, polysulfone, polyvinyl alcohol, polynorbornene, and the like. Also employable are optical uniaxial and biaxial crystals such as quartz and calcite.

As the anisotropic medium, for realizing the present invention, preferred are liquid crystal materials which can change the amount of birefringent phase difference by altering physical environments such as electromagnetic field, pressure, and temperature and fix a desirable amount of birefringent phase difference, and preferred in particular are liquid crystal materials which exhibit a nematic phase in an environment in use.

A case in which the phase shifter 4 is constituted by the nematic liquid crystal 6, which is an anisotropic medium, in the optical diode 1 will now be explained specifically.

In the phase shifter 4, the director of the nematic liquid crystal 6 is usually aligned in a direction parallel to the surfaces of the cholesteric liquid crystal layers 2, 3.

The cholesteric liquid crystal layers 2, 3 contain cholesteric liquid crystals, which can selectively reflect light in a specific wavelength band because of their helical structure. Specific examples of the cholesteric liquid crystals will be explained later.

(Nematic Liquid Crystal)

The nematic liquid crystal 6 is not limited in particular as long as it can exhibit a nematic liquid crystal phase state, and may be any of high molecular-weight liquid crystals and low molecular-weight liquid crystals. Employable as the high molecular-weight liquid crystals are various main-chain high molecular-weight liquid crystal materials, side-chain high molecular-weight liquid crystal materials, or their mixtures.

Examples of the main-chain liquid crystal material include high molecular-weight liquid crystal materials based on polyester, polyamide, polycarbonate, polyimide, polyurethane, polybenzimidazole, polybenzoxazole, polybenzothiazole, polyazomethine, polyesteramide, polyester carbonate, and polyesterimide, and their mixtures.

Examples of the side-chain liquid crystal material include high molecular-weight liquid crystal materials in which a mesogenic group is combined as a side chain to materials having skeletal chains in a linear or annular structure based on polyacrylate, polymethacrylate, polyvinyl, polysiloxane, polyether, polymalonate, and polyester, and their mixtures.

Employable as the low molecular-weight liquid crystal are compounds exhibiting liquid crystallinity in which a reactive functional group is introduced to a terminal of saturated benzene carboxylic acid derivatives, unsaturated benzene carboxylic acid derivatives, biphenylcarboxylic acid derivatives, aromatic oxycarboxylic acid derivatives, Schiff base derivatives, bisazomethine compound derivatives, azo compound derivatives, azoxy compound derivatives, cyclohexane ester compound derivatives, and sterol compound derivatives, and compositions in which a crosslinkable compound is added to compounds exhibiting liquid crystallinity among the compound derivatives.

(Cholesteric Liquid Crystal)

The cholesteric liquid crystal constituting the cholesteric liquid crystal layers 2, 3 is constituted by at least a liquid crystal material which can immobilize the cholesteric alignment.

The above-mentioned liquid crystal material encompasses high molecular-weight liquid crystal materials and low molecular-weight liquid crystal materials, whereas various main-chain high molecular-weight liquid crystal materials, side-chain high molecular-weight liquid crystal materials, or their mixtures can be used as the high molecular-weight liquid crystal material.

Examples of the main-chain liquid crystal material include high molecular-weight liquid crystal materials based on polyester, polyamide, polycarbonate, polyimide, polyurethane, polybenzimidazole, polybenzoxazole, polybenzothiazole, polyazomethine, polyesteramide, polyester carbonate, and polyesterimide, and their mixtures.

Examples of the side-chain liquid crystal material include high molecular-weight liquid crystal materials in which a mesogenic group is combined as a side chain to materials having skeletal chains in a linear or annular structure based on polyacrylate, polymethacrylate, polyvinyl, polysiloxane, polyether, polymalonate, and polyester, and their mixtures.

Preferred among them are the main-chain high molecular-weight liquid crystal materials, those based on polyester in particular, from the viewpoint of their easiness in synthesis and alignment and the like.

Preferred examples of constitutional units of polymers include aromatic or aliphatic diol units, aromatic or aliphatic dicarboxylic acid units, and aromatic or aliphatic hydroxydicarboxylic acid units.

Examples of the low molecular-weight liquid crystal materials include compounds exhibiting liquid crystallinity in which a reactive functional group is introduced to a terminal of saturated benzene carboxylic acid derivatives, unsaturated benzene carboxylic acid derivatives, biphenylcarboxylic acid derivatives, aromatic oxycarboxylic acid derivatives, Schiff base derivatives, bisazomethine compound derivatives, azo compound derivatives, azoxy compound derivatives, cyclohexane ester compound derivatives, and sterol compound derivatives, and compositions in which a crosslinkable compound is added to compounds exhibiting liquid crystallinity among the compound derivatives.

Known methods can be used as a method of forming the cholesteric liquid crystal layers 2, 3. The cholesteric liquid crystal layers 2, 3 can be obtained by forming an alignment film on a transparent substrate, carrying out a rubbing treatment to the alignment film, then applying a liquid crystal material containing the above-mentioned cholesteric liquid crystal as an essential ingredient, and heat-treating it.

(Alignment Substrate)

The alignment substrates 7, 8 are not restricted in particular as long as they can support the cholesteric liquid crystal layers 2, 3, whereas examples of the alignment substrates 7, 8 include films of polyimide, polyamide, polyamidimide, polyphenylene sulfide, polyphenylene oxide, polyetherketone, polyetheretherketone, polyethersulfone, polysulfone, polyethylene terephthalate, polyethylene naphthalate, polyarylate, triacetylcellulose, epoxy resin, and phenol resin, and uniaxially stretched films thereof. These films include those which exhibit a sufficient aligning capability for the cholesteric liquid crystal used in the cholesteric liquid crystal layers 2, 3 without additional treatment for causing the aligning capability. In the case where they exhibit an insufficient aligning capability or no aligning capability or the like, films caused to exhibit the aligning capability by stretching the films under appropriate heating, performing so-called rubbing treatment in which a film surface is unidirectionally rubbed with rayon cloth or the like, carrying out the rubbing treatment while providing an alignment film made of a known aligning agent such as polyimide, polyvinylalcohol, or silane coupling agent onto the films, effecting oblique vapor deposition with silicon oxide or the like, or appropriately combining these treatment processes if necessary may be used. Various glass sheets whose surface is provided with regular fine grooves and the like can also be used as the alignment substrates 7, 8.

Preferably employed as the alignment substrates 7, 8 are those in which rubbed polyimide films 11, 12 are formed on the transparent substrates 9, 10.

(Method of Manufacturing the Optical Diode)

The optical diode 1 can be manufactured as follows.

First, transparent alignment substrates 7, 8 are prepared. For example, glass substrates formed with rubbed alignment films are used as the alignment substrates 7, 8.

Next, the cholesteric liquid crystal constituting the cholesteric liquid crystal layers 2, 3 is mixed with a solvent, so as to prepare a liquid crystal solution with a predetermined concentration, and this liquid crystal solution is applied onto the alignment films of the alignment substrates 7, 8. This aligns the cholesteric liquid crystal. Here, the alignment of the cholesteric liquid crystal is formed by heat treatment or the like if necessary. The heat treatment aligns the liquid crystal because of the self-aligning capability inherent in the liquid crystal material by heating it to a temperature range where a liquid crystal phase emerges. Here, the cholesteric liquid crystals are selected such that the selective reflection wavelength band of the cholesteric liquid crystal layer 2 and the selective reflection wavelength band of the cholesteric liquid crystal layer 3 deviate from each other. The temperature condition for the heat treatment cannot uniformly be defined since optimal conditions and limit values vary depending on the liquid crystal phase behavior temperature (transition temperature) of the liquid crystal material in use, but is usually within the range of 10 to 300° C., preferably 30 to 250° C. The alignment of the liquid crystal may not progress sufficiently when the temperature is too low, whereas the liquid crystal material may decompose or adversely affect the alignment substrate when the temperature is too high. The heat treatment time is usually within the range of 3 sec to 60 min, preferably 10 sec to 30 min. The alignment of the liquid crystal may not complete sufficiently when the heat treatment time is shorter than 3 sec, whereas the productivity extremely worsens when the heat treatment time exceeds 60 min.

Though variable depending on the species of the cholesteric liquid crystal in use, typical examples of the solvent include those based on hydrocarbons such as toluene, xylene, butylbenzene, tetrahydronaphthalene, and decahydronaphthalene; those based on ethers such as ethylene glycol dimethyl ether, diethylene glycol dimethyl ether, propylene glycol dimethyl ether, and tetrahydrofuran; those based on ketones such as methylethylketone, methylisobutylketone, and cyclohexanone; those based on esters such as ethyl acetate, butyl acetate, ethylene glycol monomethyl ether acetate, propylene glycol monomethyl ether acetate, ethyl lactate, and γ-butyrolactone; those based on amides such as N-methyl-2-pyrrolidone, dimethylformamide, and dimethylacetamide; those based on halogenated hydrocarbons such as dichloromethane, carbon tetrachloride, tetrachloroethane, and chlorobenzene; and those based on alcohols such as butylalcohol, triethylene glycol, diacetone alcohol, and hexylene glycol. These solvents may also be used in mixtures as appropriate if necessary. The concentration of the solvent may vary depending on the molecular weight and solubility of the cholesteric liquid crystal in use, the thickness of the finally aimed cholesteric liquid crystal layers 2, 3, and the like, but is usually 1 to 60 wt %, preferably 3 to 40 wt %.

Surfactants may be added to the liquid crystal solution in order to facilitate its application. Examples of the surfactants include cationic surfactants such as imidazoline, quaternary ammonium salts, alkylamine oxide, and polyamine derivatives; anionic surfactants such as polyoxyethylene/polyoxypropylene condensate, primary or secondary alcohol ethoxylate, alkylphenol ethoxylate, polyethylene glycol and its esters, sodium laurylsulfate, ammonium laurylsulfate, laurylsulfate amines, alkyl-substituted aromatic sulfonates, alkylphosphates, and aliphatic or aromatic sulfonate formalin condensates; amphoteric surfactants such as propylbetaine laurylamide and betaine laurylaminoacetate; nonionic surfactants such as polyethylene glycol aliphatic acid esters and polyoxyethyelne alkylamines; and fluorine-based surfactants such as perfluoroalkylsulfonates, perfluororalkylcarboxylates, perfluoroalkylethylene oxide adducts, perfluoroalkyltrimethylammonium salts, oligomers containing perfluoroalkyl groups and hydrophilic groups, oligomers containing perfluoroalkyl groups and lipophilic groups, and urethanes containing perfluoroalkyl groups.

Though dependable on the species of the surfactant and solvent or the alignment films of the alignment substrates 7, 8 to be coated, the amount of the surfactant to be added is typically within the range of 10 ppm to 10%, preferably 50 ppm to 5%, more preferably 0.01% to 1%, in terms of the ratio to the weight of the cholesteric liquid crystal.

For improving the heat resistance of the cholesteric liquid crystal layers 2, 3 and the like, a crosslinking agent such as bisazide compounds and glycidyl methacrylate may be added to the liquid crystal solution by such an extent that it does not prevent the cholesteric liquid crystal phase from emerging, so as to cause crosslinking in a later step. Also, polymerizable functional groups having a basic skeleton of a biphenyl derivative, phenylbenzoate derivative, stilbene derivative, or the like having incorporated therein a functional group such as acryloyl group, vinyl group, or epoxy group may be introduced into the liquid crystal material beforehand, so as to produce a cholesteric phase and cause crosslinking.

For the coating method, any known method can be employed without limitations in particular as long as it secures uniformity in the coated film. Its examples include roll coating, die coating, dip coating, curtain coating, and spin coating. A solvent removing (drying) step by means of a heater or blowing with warm air may be performed after the coating as well. The thickness of the coated film in its dried state is usually 0.3 to 20 μm, preferably 0.5 to 10 μm, more preferably 0.7 to 3 μm. The outside of this range is unfavorable, since the resulting cholesteric liquid crystal layers 2, 3 may be short of their optical performances, the alignment of the cholesteric liquid crystal may become insufficient, and so forth.

After forming the alignment of the cholesteric liquid crystal, the alignment is immobilized. In this case, after the alignment of the cholesteric liquid crystal is completed by heat treatment or the like, the cholesteric liquid crystal on the alignment substrates 7, 8 is immobilized in this state by employing means suitable for the liquid crystal in use. Examples of such means include glass fixation by rapid cooling and crosslinking by irradiation with energy such as heat, UV rays, and electron beams.

Next, the alignment substrates 7, 8 are connected to each other with a spacer (not depicted) such that the cholesteric liquid crystal layers 2, 3 face inside. Here, the alignment substrates 7, 8 are connected to each other such that the director of the cholesteric liquid crystal in the inner surface of the cholesteric liquid crystal layer 2 and the director of the cholesteric liquid crystal in the inner surface of the cholesteric liquid crystal layer 3 are parallel to each other.

Then, a solution in which the nematic liquid crystal 6 is mixed into a solvent is prepared. This solution is sealed into the space between the alignment substrates 7, 8 by using capillary phenomenon, and then is heated, so as to remove the solvent. This forms the phase shifter 4 between the cholesteric liquid crystal layers 2, 3. Here, the director of the cholesteric liquid crystal in the inner surface of the cholesteric liquid crystal layer 2 and the director of the cholesteric liquid crystal in the inner surface of the cholesteric liquid crystal layer 3 become parallel to each other, whereby the director of the nematic liquid crystal 6 is aligned in a direction parallel to the surfaces of the alignment substrates 7, 8 when the nematic liquid crystal 6 attains a nematic liquid crystal phase. Thus, the optical diode 1 is obtained.

Though the above-mentioned manufacturing method connects the cholesteric liquid crystal layers 2, 3 to each other with the spacer, seals the solution, and then removes the solvent, so as to align the nematic liquid crystal 6, thereby forming the phase shifter 4 between the cholesteric liquid crystal layers 2, 3, the cholesteric liquid crystal layer 2, phase shifter 4, and cholesteric liquid crystal layer may be stacked on one another by using an adhesive or the like when the alignment of the nematic liquid crystal 6 is immobilized and the phase shifter 4 is prepared beforehand, i.e., when the phase shifter 4 is made of a high molecular-weight film.

Though the phase shifter 4 changes the phase difference between two intrinsic polarized light components of circularly polarized light having a rotation direction identical to the helical sense of the cholesteric liquid crystal layer 2 by 180° in this embodiment, the phase shifter 4 is not limited to the one with 180° as long as it can change the phase difference between two intrinsic polarized light components of the circularly polarized light by 160° to 200°. Substantially the same effects as those mentioned above can also be obtained in this case.

Second Embodiment

A second embodiment of the optical diode in accordance with the present invention will now be explained. Constituents identical or equivalent to those in the first embodiment will be referred to with numerals identical thereto without repeating their overlapping explanations.

Figure 2:
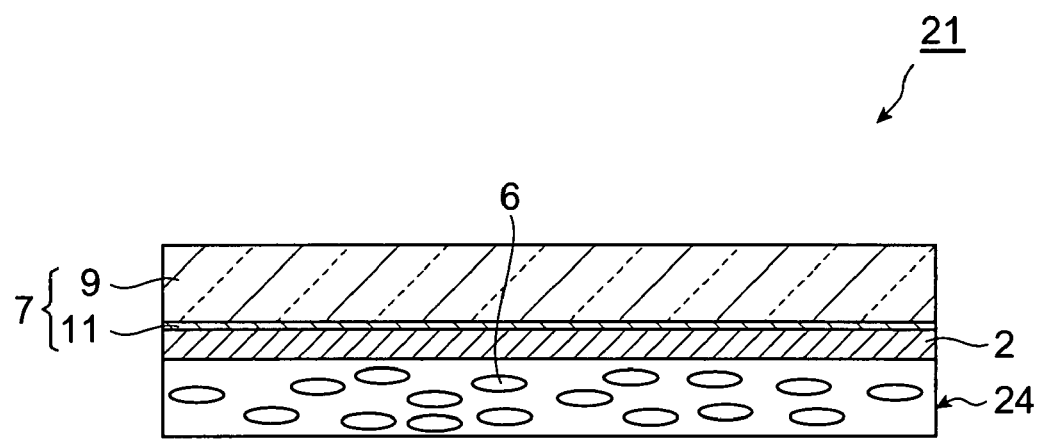
[FIG. 2] A sectional view showing a second embodiment of the optical diode of the present invention.

FIG. 2 is a sectional view schematically showing the second embodiment of the optical diode in accordance with the present invention. As shown in FIG. 2, the optical diode 21 in accordance with this embodiment differs from the optical diode 1 in accordance with the first embodiment in that the cholesteric liquid crystal layer 3 and alignment substrate 8 are omitted while a phase shifter 24 is constructed as follows.

Namely, in the optical diode 21, the phase shifter 24 differs from the phase shifter 4 in accordance with the first embodiment, which functions as a half-wavelength element for polarized light at a wavelength between the center wavelength of the selective reflection wavelength band of the cholesteric liquid crystal layer 2 and the center wavelength of the selective reflection wavelength band of the cholesteric liquid crystal layer 3, in that it changes the phase difference between two intrinsic polarized light components of circularly polarized light having a rotation direction identical to the helical sense of the cholesteric liquid crystal layer 2 by about 180°, so as to emit circularly polarized light having a rotation direction opposite to the helical sense of the cholesteric liquid crystal layer 2. In this embodiment, the helical sense of the cholesteric liquid crystal layer 2 is left-handed, i.e., the phase shifter 24 changes the phase of the left-handed circularly polarized light by 180°, so as to emit right-handed circularly polarized light. Namely, the phase shifter 24 functions as a half-wavelength element for the left-handed circularly polarized light incident thereon.

In this optical diode 21, left-handed circularly polarized light having a wavelength within the selective reflection wavelength band of the cholesteric liquid crystal layer 2 is made incident on the phase shifter 24. Here, a wavelength within the selective reflection wavelength band of the cholesteric liquid crystal layer 2 is used as the wavelength of the incident left-handed circularly polarized light.

Then, the phase shifter 24 changes the phase difference between two intrinsic polarized light components of the left-handed circularly polarized light by 180°, so as to yield right-handed circularly polarized light.

The right-handed circularly polarized light emitted from the phase shifter 24 is made incident on the cholesteric liquid crystal layer 2. Here, the right-handed circularly polarized light has a rotation direction opposite to the helical sense of the cholesteric liquid crystal layer 2 while having a wavelength within the selective reflection wavelength band of the cholesteric liquid crystal layer 2. Therefore, the right-handed circularly polarized light can be transmitted through the cholesteric liquid crystal layer 2. When left-handed circularly polarized light having a wavelength within the selective reflection wavelength band of the cholesteric liquid crystal layer 2 is incident on the cholesteric liquid crystal layer 2, on the other hand, this left-handed circularly polarized light is selectively reflected by the cholesteric liquid crystal layer 2.

The optical diode 21 can lower its cost, since it does not require a large amount of time and labor. Further, since the optical diode 21 does not utilize the nonlinear optical effect, it is not necessary for laser light having such a high intensity as to cause the nonlinear optical effect to be incident thereon as incident light. Therefore, it can save power as well.

Though the phase shifter 24 changes the phase difference between two intrinsic polarized light components of circularly polarized light having a rotation direction identical to the helical sense of the cholesteric liquid crystal layer 2 by 180° in this embodiment, the phase shifter 24 is not limited to the one with 180° as long as it can change the phase difference between two intrinsic polarized light components of the circularly polarized light by 160° to 200°. Substantially the same effects as those mentioned above can also be obtained in this case.

Third Embodiment

A third embodiment of the optical diode in accordance with the present invention will now be explained.

Figure 3:
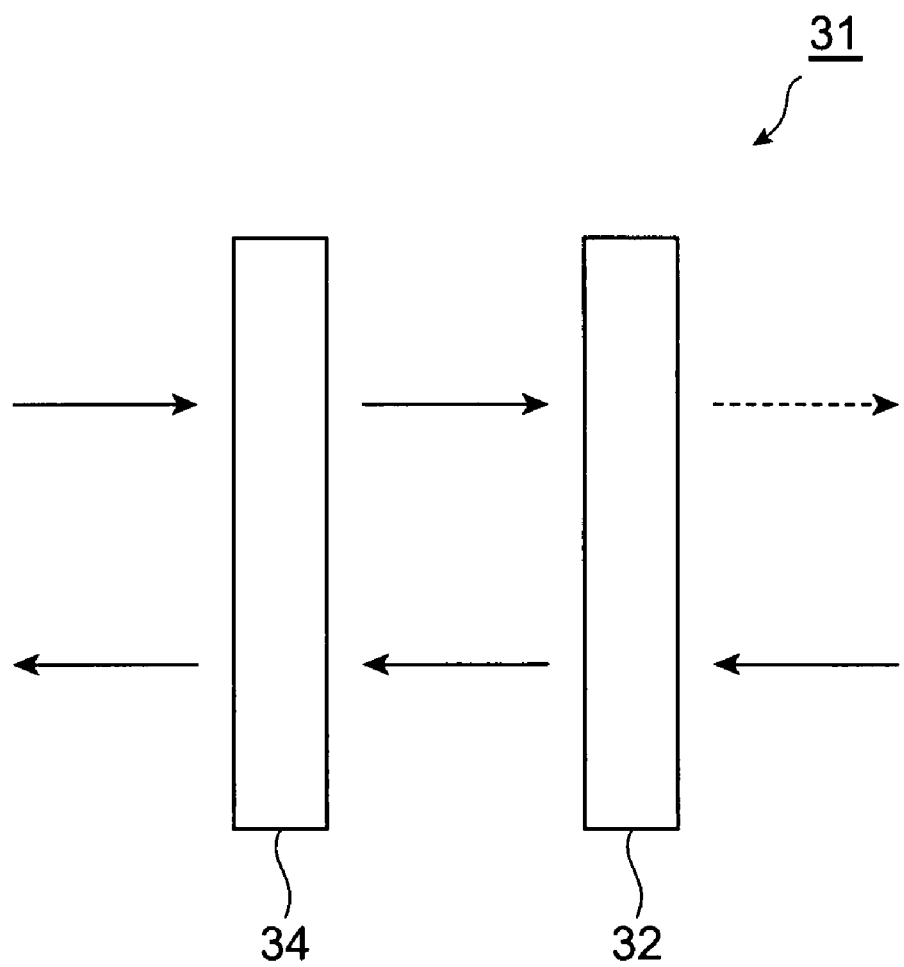
[FIG. 3] A side view showing a third embodiment of the optical diode of the present invention.

FIG. 3 is a side view showing the third embodiment of the optical diode in accordance with the present invention. As shown in FIG. 3, the optical diode 31 in accordance with this embodiment comprises a phase shifter 34 which changes the phase difference between two intrinsic polarized light components of incident polarized light and a linearly polarizing element 32 in which a transmission axis is provided such as to form an angle of about 45° with a fast axis of the phase shifter 34. In FIG. 3, the dotted arrow indicates that there is no transmitted light along its direction, whereas the solid arrows indicate that electric field components of transmitted light exist. The phase shifter 34 and linearly polarizing element 32 are arranged so as to be separated from each other in FIG. 3, but are bonded together with an adhesive or the like in practice.

When linearly polarized light parallel to an absorption axis of the linearly polarizing element 32 is incident from the phase shifter 34 side in the optical diode 31, the polarization direction of the linearly polarized light is rotated by 90°, so that linearly polarized light perpendicular to the absorption axis of the linearly polarizing element 32 is emitted. When incident on the linearly polarizing element 32, this linearly polarized light is completely transmitted therethrough since it is perpendicular to the absorption axis of the linearly polarizing element 32.

On the other hand, linearly polarized light parallel to the absorption axis of the linearly polarizing element 32 is made incident from the linearly polarizing element 32 side. Here, the linearly polarized light is completely absorbed by the linearly polarizing element 32, so that the linearly polarizing element 32 emits no light, whereby the phase shifter 34 yields no emissions.

Thus, the optical diode characteristic is realized in the optical diode 31.

The optical diode 31 can lower its cost, since it does not require a large amount of time and labor. Further, since the optical diode 31 does not utilize the nonlinear optical effect, it is not necessary for laser light having such a high intensity as to cause the nonlinear optical effect to be incident thereon as incident light. Therefore, it can save power as well.

The third embodiment uses a half-wavelength element as the phase shifter. The half-wavelength element is arranged such that its fast axis forms an angle of about 45° with the transmission axis of the linearly polarizing element 32. As the phase shifter 34, one similar to the phase shifter 4 of the first embodiment can be used.

Fourth Embodiment

A fourth embodiment of the optical diode in accordance with the present invention will now be explained.

Figure 4:
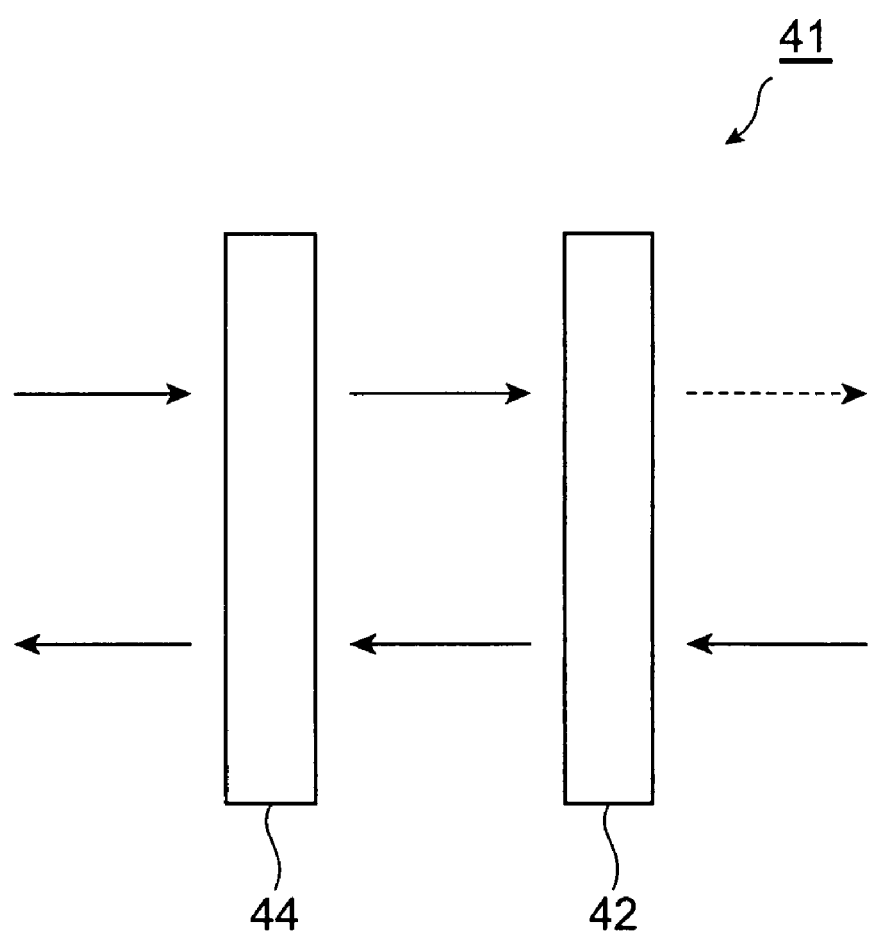
[FIG. 4] A side view showing a fourth embodiment of the optical diode of the present invention.

FIG. 4 is a side view showing the fourth embodiment of the optical diode in accordance with the present invention. As shown in FIG. 4, the optical diode 41 in accordance with this embodiment comprises a 90° rotator 44 which rotates the polarization direction of incident polarized light by about 90° and a linearly polarizing element 42. The slow axis on the linearly polarizing element 42 side of the 90° rotator 44 is substantially parallel to the transmission axis of the linearly polarizing element 42, whereas the slow axis on the side opposite from the linearly polarizing element 42 of the 90° rotator 44 is substantially perpendicular to the transmission axis of the linearly polarizing element 42, whereby the polarization direction of the incident polarized light rotates by about 90° in the 90° rotator 44. The direction of rotation may be either left- or right-handed in this case.

In FIG. 4, the dotted arrow indicates that there is no transmitted light along its direction, whereas the solid arrows indicate that electric field components of transmitted light exist. The 90° rotator 44 and linearly polarizing element 42 are arranged so as to be separated from each other in FIG. 4, but are bonded together with an adhesive or the like in practice.

When linearly polarized light perpendicular to the transmission axis of the linearly polarizing element 42 is incident from the 90° rotator 44 side in the optical diode 41, the polarization direction of the linearly polarized light is rotated by 90°, whereby linearly polarized light parallel to the transmission axis of the linearly polarizing element 42 is emitted. When incident on the linearly polarizing element 42, this linearly polarized light is completely transmitted therethrough since it is parallel to the transmission axis of the linearly polarizing element 42.

On the other hand, linearly polarized light perpendicular to the transmission axis of the linearly polarizing element 42 is made incident from the linearly polarizing element 42 side. Here, the linearly polarized light is completely absorbed by the linearly polarizing element 42, so that the linearly polarizing element 42 emits no light, whereby the 90° rotator 44 yields no emissions.

Thus, the optical diode characteristic is realized in the optical diode 41.

The optical diode 41 can lower its cost, since it does not require a large amount of time and labor. Further, since the optical diode 41 does not utilize the nonlinear optical effect, it is not necessary for laser light having such a high intensity as to cause the nonlinear optical effect to be incident thereon as incident light. Therefore, it can save power as well.

The 90° rotator 44 is not limited in particular as long as it changes the polarization direction of the incident linearly polarized light by about 90°. For example, the 90° rotator 44 is constituted by an optically active medium having a light-rotating capability. As the optically active medium, one containing a twisted nematic liquid crystal is used. Optical crystals having a light-rotating capability such as quartz and sodium perchlorate can also be used.

For realizing the present invention, preferred are liquid crystal materials which can change the amount of optical rotation by altering physical environments such as electromagnetic field, pressure, and temperature and can fix a desirable amount of optical rotation, liquid crystal materials exhibiting a twisted nematic phase in the environment in use in particular.

The present invention is not limited to the above-mentioned first to fourth embodiments. For example, though the phase shifters 4, 24, 34 are constituted by an anisotropic medium in the first, second, and third embodiments, the optical diodes 1, 21, 31 may further comprise a pair of electrodes holding the anisotropic medium therebetween when the nematic liquid crystal contained in the anisotropic medium is a low molecular-weight liquid crystal and exhibits a nematic liquid crystal phase at a temperature in use (e.g., room temperature). The pair of electrodes may hold the anisotropic medium directly or indirectly therebetween.

Figure 5:
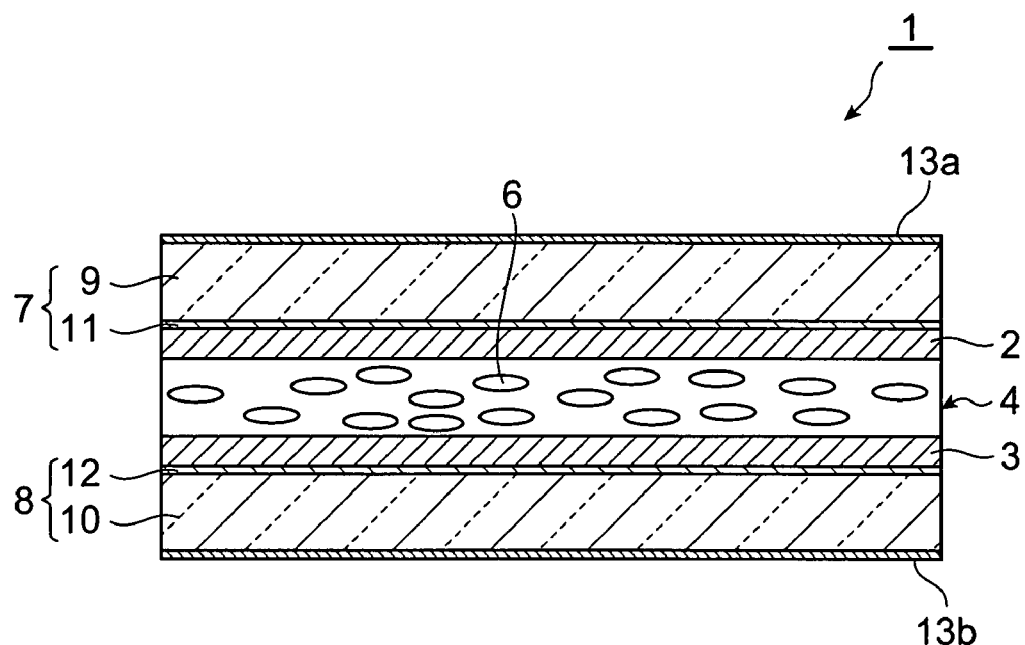
[FIG. 5] A sectional view showing a fifth embodiment of the optical diode of the present invention.

In the case of the optical diode 1 by way of example, as shown in FIG. 5, a pair of electrodes 13a, 13b are provided as outermost layers of the optical diode 1. Specifically, the electrode 13a is provided on the transparent substrate 9 on the side opposite from the cholesteric liquid crystal layer 2, whereas the electrode 13b is provided on the transparent substrate 10 on the side opposite from the cholesteric liquid crystal layer 3.

Figure 6:
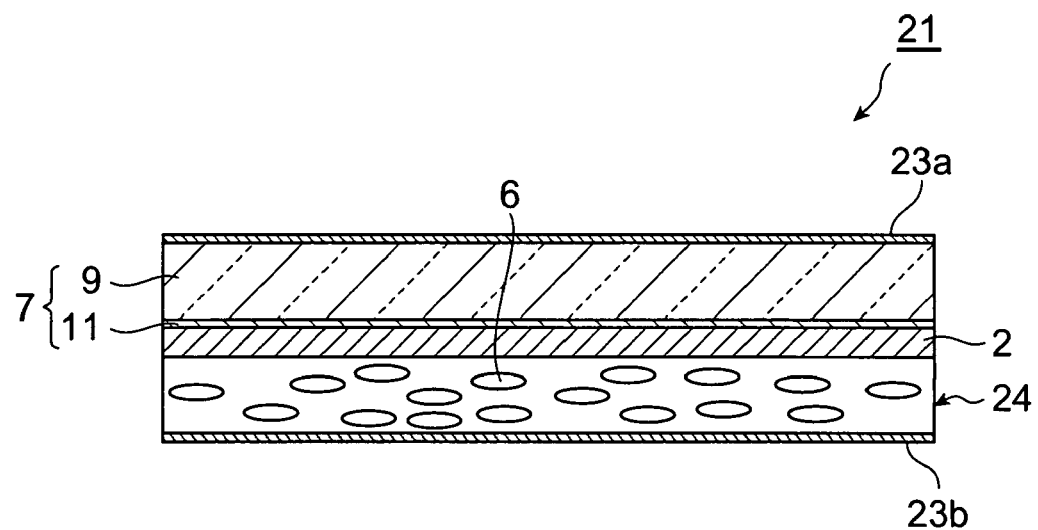
[FIG. 6] A sectional view showing a sixth embodiment of the optical diode of the present invention.

In the case of the optical diode 21, as shown in FIG. 6, a pair of electrodes 23a, 23b are provided as outermost layers of the optical diode 21. Specifically, the electrode 23a is provided on the transparent substrate 9 on the side opposite from the cholesteric liquid crystal layer 2, whereas the electrode 23b is provided on the surface of the phase shifter 24 on the side opposite from the cholesteric liquid crystal layer 2.

Figure 7:
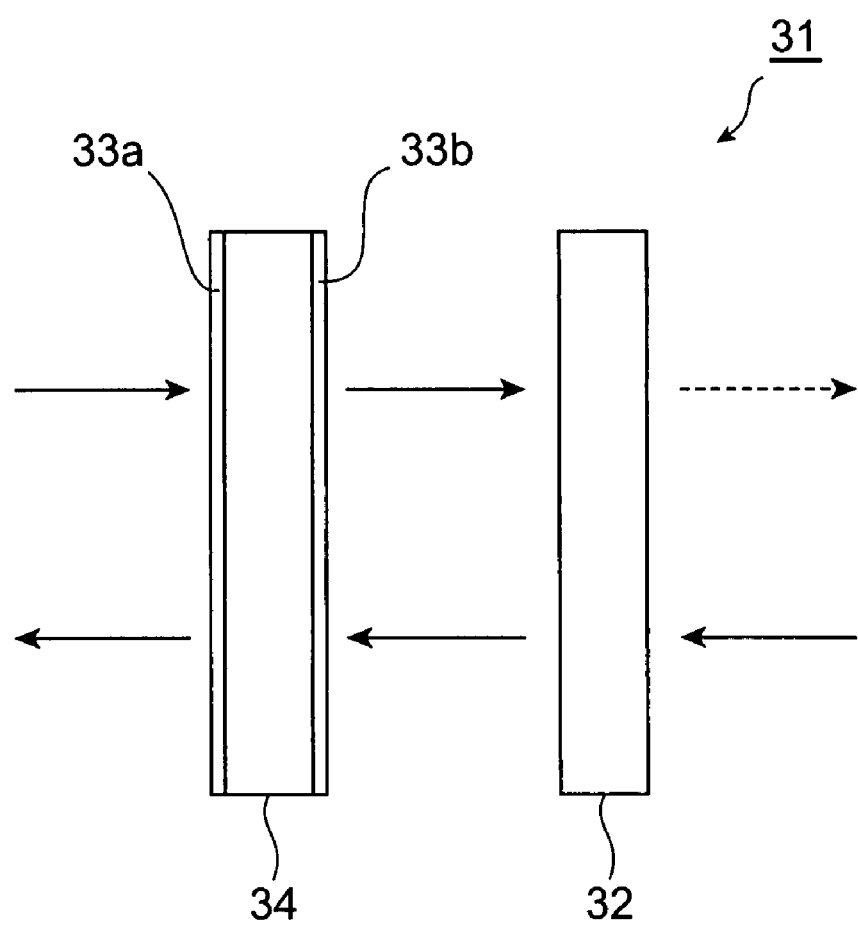
[FIG. 7] A side view showing a seventh embodiment of the optical diode of the present invention.

In the case of the optical diode 31, as shown in FIG. 7, a pair of electrodes 33a, 33b are provided so as to hold the phase shifter 34 therebetween. The electrode 33a is provided on the phase shifter 34 on the side opposite from the linearly polarizing element 32, whereas the electrode 33b is provided on the phase shifter 34 on the linearly polarizing element 32 side.

Figure 8:
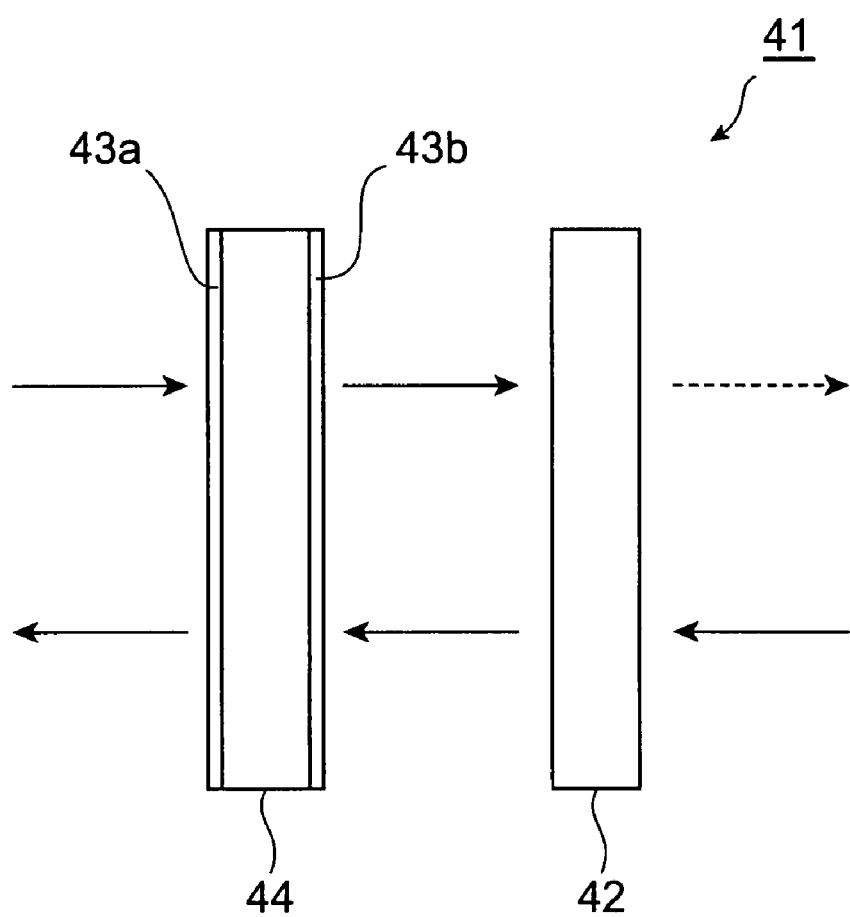
[FIG. 8] A side view showing an eighth embodiment of the optical diode of the present invention.

Though the rotator 44 is constituted by an anisotropic medium in the fourth embodiment, the optical diode 41 may further comprise a pair of electrodes 43a, 43b holding the optically active medium therebetween as shown in FIG. 8 when the twisted nematic liquid crystal contained in the optically anisotropic medium is a low molecular-weight liquid crystal and exhibits a nematic liquid crystal phase at a temperature in use. The electrode 43a is provided on the phase shifter 44 on the side opposite from the linearly polarizing element 42, whereas the electrode 43b is provided on the phase shifter 44 on the linearly polarizing element 42 side. In these cases, the anisotropy in the anisotropic or optically active medium can be adjusted by regulating the voltage applied between the electrodes. This can adjust the contrast ratio between the transmitted light in the case where circularly polarized light is incident from the cholesteric liquid crystal layer 2 side or linearly polarized light is incident from the side of the linearly polarizing elements 32, 42 and the transmitted light in the case where circularly polarized light is incident from the cholesteric liquid crystal layer 3 side or linearly polarized light is incident from the side of the phase shifter 24 or rotator 44 to an appropriate value. Even when the anisotropy is fluctuated by a change in temperature in the rotator, for example, applying a voltage between the pair of electrodes changes the alignment of the nematic liquid crystal and thus can adjust the anisotropy in the phase shifter. Therefore, the optical diode characteristic can be held constant regardless of changes in temperature. The low molecular-weight liquid crystal refers to one having a molecular weight of 200 to 500.

EXAMPLES

In the following, details of the present invention will be explained with reference to examples and comparative examples, though the present invention is not limited to the following examples.

Example 1

First, a liquid crystal mixture (LC film manufactured by Nippon Oil Corporation) of a high molecular-weight achiral nematic liquid crystal made of aromatic polyester and a high molecular-weight chiral nematic liquid crystal made of aromatic polyester was dissolved in chloroform, so as to yield a high molecular-weight cholesteric liquid crystal solution. Here, the mixing ratio (content) of the high molecular-weight chiral nematic liquid crystal in the liquid crystal mixture was 93 mass %, whereas the concentration of the liquid crystal mixture in the high molecular-weight cholesteric liquid crystal solution was 10 mass %.

This high molecular-weight cholesteric liquid crystal solution was spin-cast onto a glass substrate having a unidirectionally rubbed polyimide alignment film (1254 manufactured by JSR Corporation), heated to 180° C., aligned for 2 min, and then rapidly cooled so as to be vitrified, whereby the cholesteric alignment was immobilized. Thus, a favorably aligned first polymer cholesteric liquid crystal (PCLC) film having a thickness of about 3 μm was obtained on the glass substrate. When the transmission spectrum of the first PCLC was determined, the center wavelength of the selective reflection wavelength band in the first PCLC film was about 505 nm. When the quantity of transmitted light was measured while right-handed circularly polarized light and left-handed circularly polarized light were made incident on the first PCLC film, the quantity of transmitted light was smaller in the case where the left-handed circularly polarized light was incident, which showed that the helical sense in the first PCLC film was left-handed. The transmission spectrum of the first PCLC film was determined, and $n_e$ and $n_o$ were determined from wavelengths which became short and long wavelength ends of the selective reflection wavelength band, whereby $n_e=1.80$ and $n_o=1.60$. The helical axis of the first PCLC film was perpendicular to the glass substrate surface.

On the other hand, a second PCLC film was made as with the first PCLC film except that the mixing ratio (content) of the high molecular-weight chiral nematic liquid crystal in the liquid crystal mixture was 82 mass % and that the concentration of the mixture in the high molecular-weight cholesteric liquid crystal solution was 10 mass %. Then, the center wavelength of the selective reflection wavelength band and the helical sense were determined in the second PCLC film as in the first PCLC film, whereby the center wavelength of the selective reflection wavelength band was about 590 nm, and the helical sense was left-handed in the second PCLC film. Also, $n_e$ and $n_o$ were determined in the second PCLC film as in the first PCLC film, whereby $n_e=1.80$ and $n_o=1.60$. The helical axis of the second PCLC film was perpendicular to the glass substrate surface.

On the other hand, a high molecular-weight achiral nematic liquid crystal (LC film manufactured by Nippon Oil Corporation) made of aromatic polyester was dissolved in chloroform, so as to yield a high molecular-weight nematic liquid crystal solution. Here, the high molecular-weight liquid crystal concentration in the high molecular-weight nematic liquid crystal solution was 10 mass %.

This high molecular-weight nematic liquid crystal solution was spin-cast onto a glass substrate having a unidirectionally rubbed polyimide alignment film (1254 manufactured by JSR Corporation), heated to 180° C., aligned for 3 min, and then rapidly cooled so as to be vitrified, whereby the nematic alignment was immobilized. Thus, a favorably aligned polymer nematic liquid crystal (NLC) film having a thickness of about 1.4 μm was obtained on the glass substrate. The retardation of the NLC film determined by an automatic birefringence analyzer KOBRA-21ADH manufactured by Oji Scientific Instruments was found to be 278 nm at light having a wavelength of 550 nm, whereby a phase shifter functioning as a half-wavelength plate was obtained.

Next, the half-wavelength plate made of the NLC film was stacked on the first PCLC film with a UV-curable adhesive interposed therebetween, and then the glass substrate on the NLC film side was peeled off. Further, the second PCLC film was bonded to the peeled surface with a UV-curable adhesive interposed therebetween such that the high molecular-weight cholesteric liquid crystal surface came into contact therewith, thus yielding an optical diode in which the thickness of the laminate excluding the thickness of the glass substrate was about 20 μm.

Comparative Example 1

A laminate was obtained as in Example 1 except that no phase shifter was provided between the first and second PCLC films.

(Determination of Transmission Spectra)

Figure 9:
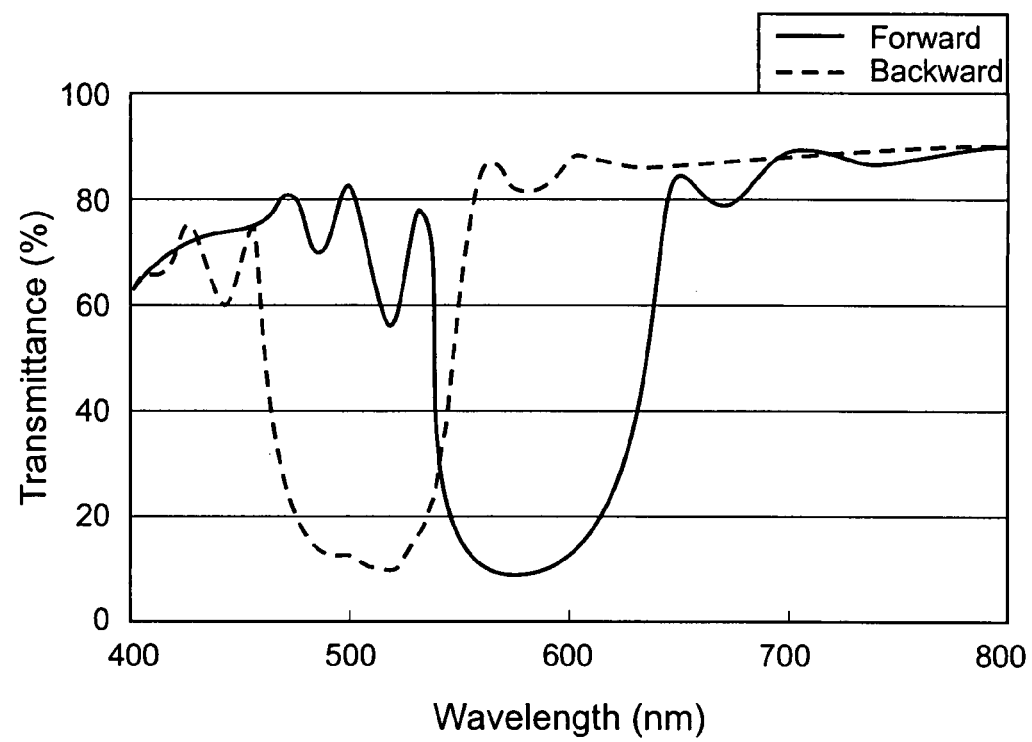
[FIG. 9] A graph showing transmission spectra obtained when right-handed circularly polarized light is incident on a laminate of Example 1.
Figure 10:
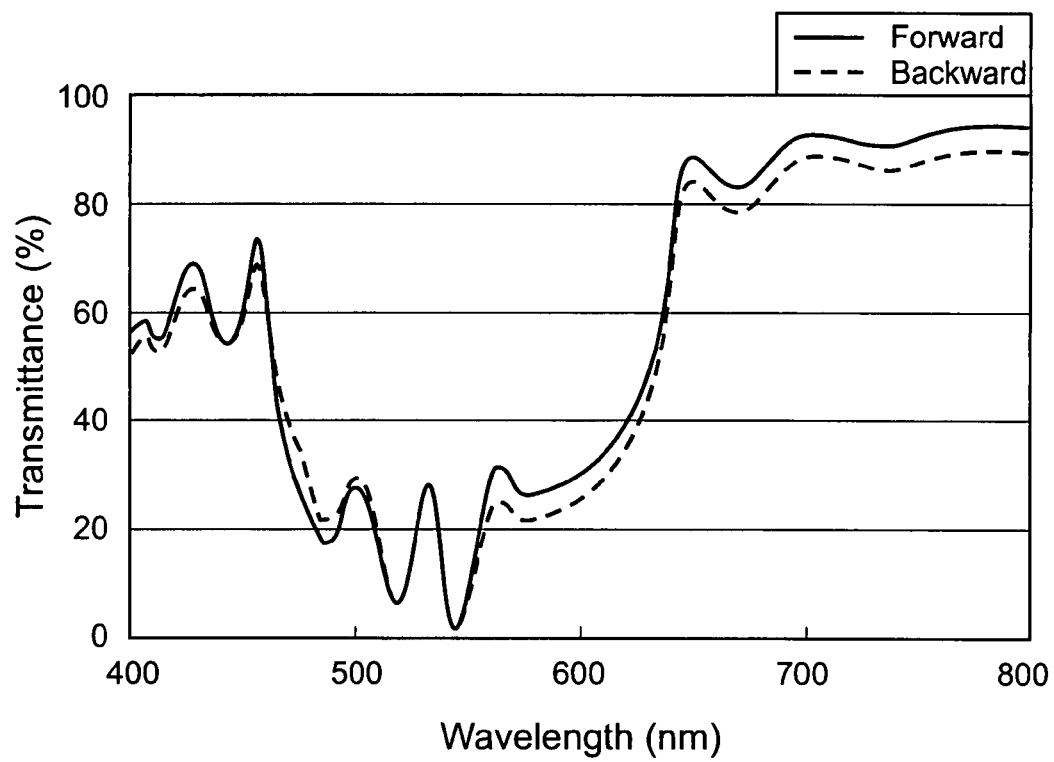
[FIG. 10] A graph showing transmission spectra obtained when left-handed circularly polarized light is incident on a laminate of Comparative Example 1.

Using a UV/visible spectrophotometer V-560 manufactured by JASCO Corporation, transmission spectra were determined in the laminates obtained in Example 1 and Comparative Example 1. Here, the incident light was right-handed circularly polarized light obtained by using a right-handed circularly polarizing plate adapted to transmit right-handed circularly polarized light therethrough. The transmission spectra were determined in the case (Forward) where the first PCLC film faced the incident light side and the case (Backward) where the second PCLC film faced the incident light side. FIGS. 9 and 10 show the respective results concerning the laminates of Example 1 and Comparative Example 1. In the case of Example 1, the selective reflection wavelength bands were found to differ and deviate from each other between Forward and Backward as shown in FIG. 9. In the laminate of Comparative Example 1, by contrast, the selective reflection wavelength bands were found to coincide with each other between Forward and Backward as shown in FIG. 10.

Figure 11:
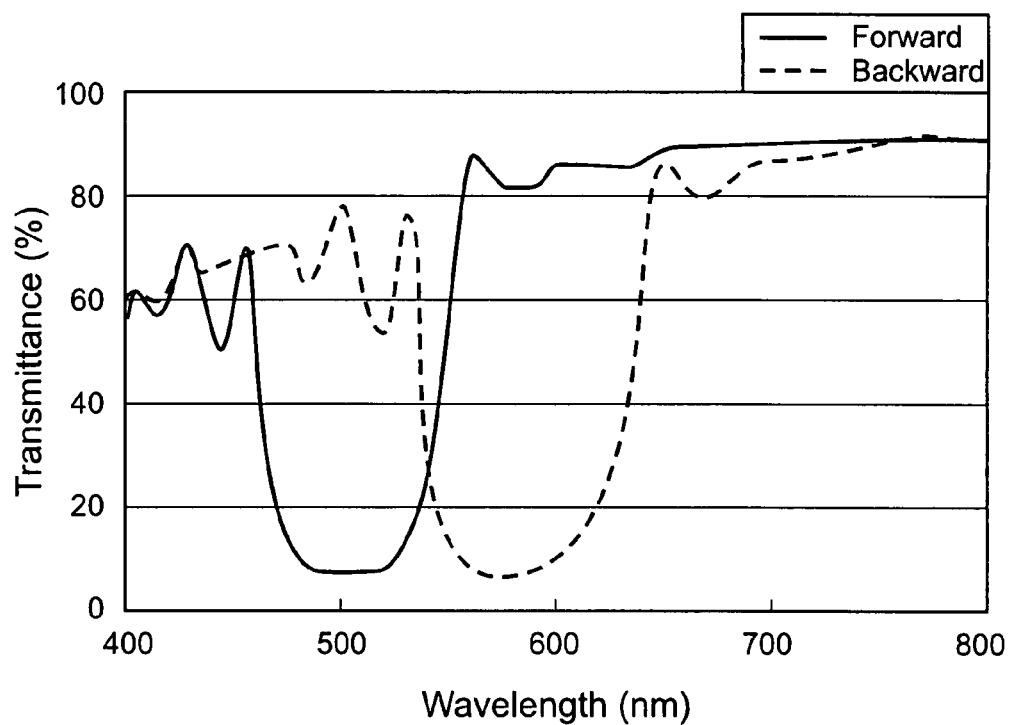
[FIG. 11] A graph showing transmission spectra obtained when left-handed circularly polarized light is incident on the laminate of Example 1.

While FIG. 9 indicates the results obtained when right-handed circularly polarized light was made incident on the laminate of Example 1, left-handed circularly polarized light was also made incident on the laminate of Example 1. FIG. 11 shows the results. The selective reflection wavelength bands were found to differ and deviate from each other between Forward and Backward in the case where the left-handed circularly polarized light was made incident on the laminate of Example 1 as in the case where the right-handed circularly polarized light was made incident thereon as shown in FIG. 11. However, the selective reflection wavelength bands were found to reverse between Forward and Backward as compared with the case where the right-handed circularly polarized light was made incident thereon.

(Verification of Optical diode Characteristic)

Table 1 shows an example in which quantities of transmitted light at two typical wavelength points are listed for each species of incident circularly polarized light and incident direction from the transmission spectra shown in FIGS. 9 and 11. It was verified from Table 1 that the quantity of transmitted light changed greatly depending on species of incident circularly polarized light and the incident direction thereof, thus yielding the optical diode characteristic.

TABLE 1

|  | Forward | | Backward | |
|---|---|---|---|---|
|  | 505 nm | 590 nm | 505 nm | 590 nm |
| When right-handed circularly polarized light is incident | 78.2% | 11.1% | 11.6% | 83.9% |
| When left-handed circularly polarized light is incident | 7.0% | 82.1% | 73.5% | 7.3% |

The quantity of transmitted light was the same between the cases of Forward and Backward in the laminate of Comparative Example 1. This verified that the laminate of Comparative Example 1 showed no optical diode characteristic.

Example 2

A first PCLC film having a selective reflection wavelength of about 510 nm was obtained as in Example 1 except that a conductive glass sheet having an ITO layer attached thereto was used as the glass substrate. As in the procedure described in Example 1, the PCLC film was made on the surface of a unidirectionally rubbed polyimide alignment film (1254 manufactured by JSR Corporation) formed on the side of the glass substrate opposite from the ITO layer surface.

When quantities of transmitted light were determined while right-handed circularly polarized light and left-handed circularly polarized light were made incident on the first PCLC film, the quantity of transmitted light was smaller in the case where the right-handed circularly polarized light was incident thereon, whereby the helical sense was found to be right-handed in the first PCLC film.

Next, the first ITO-layer-attached glass sheet formed with the PCLC film and the second ITO-layer-attached glass sheet were connected to each other with a spacer made of polyethylene terephthalate (PET) having a thickness of 12.5 μm interposed therebetween such that they were parallel to each other while the ITO-film-attached surfaces of the glass sheets were arranged inside.

On the other hand, a commercially available low molecular-weight mixture (ZLI2293 manufactured by Merck; $n_e$=1.631, $n_o$=1.499) of nematic liquid crystal (NLC) was introduced into the space between the first and second PCLC films by utilizing capillary phenomenon, and chloroform was evaporated at 70° C., so as to form a phase shifter having a thickness of 1.92 μm. The retardation of this phase shifter determined by an automatic birefringence analyzer KOBRA-21ADH manufactured by Oji Scientific Instruments was found to be about 252 nm.

Thus, a laminate constituted by the phase shifter functioning as a half-wavelength plate for light having a wavelength of about 510 nm and the PCLC films having a selective reflection wavelength band whose center wavelength was about 510 nm was made.

(Determination of Transmission Spectra)

Using a UV/visible spectrophotometer V-560 manufactured by JASCO Corporation, transmission spectra were determined in the laminate obtained in Example 2. Here, the incident light was right-handed circularly polarized light obtained by using a right-handed circularly polarizing plate adapted to transmit right-handed circularly polarized light therethrough. Voltages were applied between the ITO layers of the two conductive glass sheets, so as to alter the state of alignment of the nematic liquid crystal forming the phase shifter, thereby changing the retardation of the phase shifter.

Figure 12:
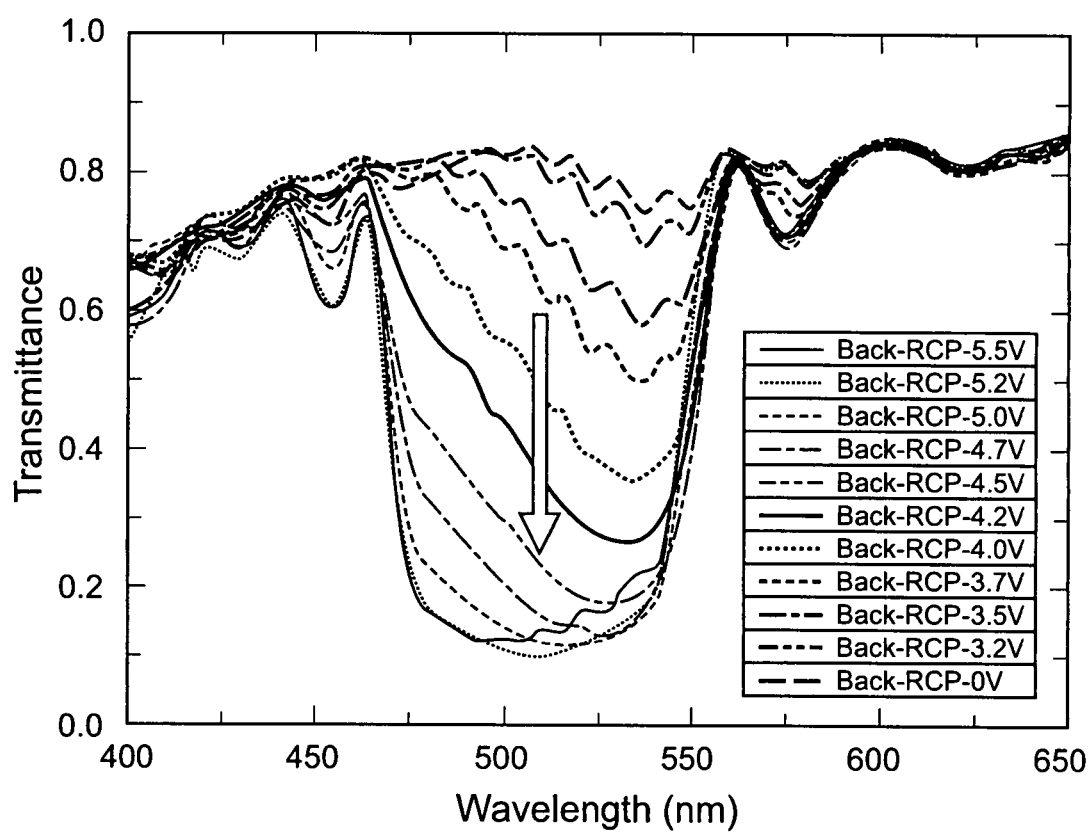
[FIG. 12] A graph showing transmission spectra obtained when right-handed circularly polarized light is incident on a laminate of Example 2 while changing applied voltage.

The transmission spectra were determined in the case (Backward) where the phase shifter faced the incident light side. FIG. 12 shows the results concerning the laminate of Example 2. In the case of Example 2, the transmittance within the selective reflection wavelength band was found to vary clearly in response to the applied voltage as shown in FIG. 12. Namely, in the state where no voltage is applied, the phase shifter functioning as a half-wavelength plate changes the phase difference between two intrinsic polarized light components of the incident right-handed circularly polarized light by 180°, so that the light becomes substantially left-handed circularly polarized light when emitted from the phase shifter, and thus is nearly completely transmitted through the right-handedly wound PCLC film when incident thereon. It was verified that, as the applied voltage gradually increased from 0 V to 5 V, the phase shifter decreased its retardation, thereby lowering the quantity of transmitted light emitted.

This proved that the optical diode characteristic was controllable by voltage.

Example 3

The phase shifter made in Example 1 was bonded to a linearly polarizing plate SRW862AP manufactured by Sumitomo Chemical Co., Ltd. with an adhesive, so as to yield a laminate. Here, they were bonded together such that the aligned direction of the longer axis of the high molecular-weight liquid crystal constituting the phase shifter and the absorption axis of the linearly polarizing plate formed an angle of 45°.

Example 4

A rotator "Nisseki LC film (90° rotator)" manufactured by Nippon Oil Corporation was bonded to a linearly polarizing plate SRW862AP manufactured by Sumitomo Chemical Co., Ltd. with an adhesive, so as to yield a laminate. Here, they were bonded together such that the aligned direction of the longer axis of the high molecular-weight liquid crystal on the polarizer side of the rotator and the transmission axis of the polarizer were parallel to each other.

(Determination of Transmission Spectra)

Using a UV/visible spectrophotometer V-560 manufactured by JASCO Corporation, transmission spectra were determined in the laminates obtained in Examples 3, 4. Here, using a linear polarizer, the incident light was turned into linearly polarized light parallel to the transmission axis of the polarizer. The transmission spectra were determined at wavelength of 550 nm in the case (Forward) where the phase shifter faced the incident light side and the case (Backward) where the polarizer faced the incident light side. As a result, the quantity of transmitted light in Backward was found to be at least 10 times that in Forward.

This verified that the optical diode characteristic was attained in the laminates obtained in Examples 3, 4.

The invention claimed is:

1. An optical diode comprising:
   a cholesteric liquid crystal layer having a selective reflection wavelength band;
   a phase shifter for changing a phase difference between two intrinsic polarized light components at a wavelength within the selective reflection wavelength band of the cholesteric liquid crystal layer; and
   a second cholesteric liquid crystal layer having a selective reflection wavelength band different from that of the cholesteric liquid crystal layer acting as a first cholesteric liquid crystal layer;
   wherein the phase shifter changes a phase difference between two intrinsic polarized light components at a wavelength between a center wavelength of the selective reflection wavelength band of the first cholesteric liquid crystal layer and a center wavelength of the selective reflection wavelength band of the second cholesteric liquid crystal layer by 160° to 200°.

2. An optical diode according to claim 1,
   wherein the phase shifter changes a phase difference between two intrinsic polarized light components at a wavelength which is within the selective reflection wavelength band of the first cholesteric liquid crystal layer but outside the selective reflection wavelength band of the second cholesteric liquid crystal layer by 160° to 200°.

3. An optical diode according to claim 2, further comprising a pair of electrodes holding the phase shifter therebetween, the phase shifter being constituted by a low molecular-weight nematic liquid crystal.

4. An optical diode according to claim 1, further comprising a pair of electrodes holding the phase shifter therebetween, the phase shifter being constituted by a low molecular-weight nematic liquid crystal.

* * * * *

UNITED STATES PATENT AND TRADEMARK OFFICE
CERTIFICATE OF CORRECTION

| | |
|---|---|
| PATENT NO. | : 7,701,537 B2 |
| APPLICATION NO. | : 11/712954 |
| DATED | : April 20, 2010 |
| INVENTOR(S) | : Hideo Takezoe et al. |

Page 1 of 1

It is certified that error appears in the above-identified patent and that said Letters Patent is hereby corrected as shown below:

Title Page, after Item (65), the Prior Publication Data, insert the following missing data:

--Related U.S. Application Data

(63) Continuation of application No. PCT/JP05/16132, filed Sept. 2, 2005

(30) Foreign Application Priority Data

Sept. 3, 2004 (JP)...........................P2004-257718--

Signed and Sealed this

Twentieth Day of July, 2010

David J. Kappos
*Director of the United States Patent and Trademark Office*